US009355875B2

(12) United States Patent
Konishi et al.

(10) Patent No.: US 9,355,875 B2
(45) Date of Patent: May 31, 2016

(54) LIQUID PROCESSING APPARATUS

(75) Inventors: Teruaki Konishi, Koshi (JP); Takahiro Tetsuka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1097 days.

(21) Appl. No.: 13/337,573

(22) Filed: Dec. 27, 2011

(65) Prior Publication Data

US 2012/0160279 A1 Jun. 28, 2012

(30) Foreign Application Priority Data

Dec. 28, 2010 (JP) ................................. 2010-293627

(51) Int. Cl.
*H01L 21/67* (2006.01)
*H01L 21/677* (2006.01)

(52) U.S. Cl.
CPC ...... *H01L 21/67178* (2013.01); *H01L 21/6708* (2013.01); *H01L 21/6719* (2013.01); *H01L 21/67051* (2013.01); *H01L 21/67742* (2013.01)

(58) Field of Classification Search
CPC ................................................ H01L 21/67051
See application file for complete search history.

(56) References Cited

FOREIGN PATENT DOCUMENTS

JP 2008-034490 A 2/2008
KR 10-2008-0010325 B1 1/2008

*Primary Examiner* — Jason Ko
(74) *Attorney, Agent, or Firm* — Pearne & Gordon LLP

(57) ABSTRACT

Liquid processing units 2 each for performing a liquid process on a substrate are arranged horizontally side by side, a gas exhaust pipe 3 for exhausting an atmosphere within the liquid processing units is provided under the liquid processing units 2 to be extended along an arrangement of the liquid processing units 2, and a flow control member group 402 is disposed under the gas exhaust pipe 3. Liquid supply main pipe 5 and liquid drain main pipe 6 are provided under the flow control member group 402 to be extended along the arrangement of the liquid processing units 2. Liquid supply branch pipes are branched from the liquid supply main pipe 5 and connected with the liquid processing unit 2 via the flow control member group 402, and liquid drain branch pipes are branched from the liquid drain main pipe 6 and connected with the liquid processing unit 2.

13 Claims, 14 Drawing Sheets

LIQUID PROCESSING APPARATUS
1

LIQUID PROCESSING APPARATUS

CROSS-REFERENCE TO RELATED APPLICATION

This application claims the benefit of Japanese Patent Application No. 2010-293627 filed on Dec. 28, 2010, the entire disclosures of which are incorporated herein by reference in their entirety.

FIELD OF THE INVENTION

The present disclosure relates to a technique for performing a liquid process by supplying multiple kinds of processing solutions to a substrate.

BACKGROUND OF THE INVENTION

In a semiconductor manufacturing process, a liquid process may be performed on a substrate. Such liquid process may include a substrate cleaning process with a cleaning solution, a substrate coating process with a coating solution, an etching process with an etching solution, a developing process with a developing solution, or the like. A liquid processing unit for use in performing these liquid processes includes, for example, a cup; a rotary member such as a spin chuck, disposed in the cup; a nozzle for supplying a processing solution to a substrate; and an exhaust port for exhausting an inside of the cup. When the substrate cleaning process or the like is performed, multiple kinds of processing solutions may be prepared and a multiple number of exhaust pipes may be provided according to the multiple kinds of processing solutions.

In a liquid processing apparatus equipped with such a liquid processing unit, a multiple number of pipe groups or a control member group may be disposed under the liquid processing unit. The pipe groups may include a liquid supply pipe group for supplying the various kinds of processing solutions, a liquid drain pipe group for draining the various processing solutions after the processing solutions are used, a gas exhaust pipe group for exhausting an exhaust gas including vapor of the processing solutions, or the like. The control member group may include a flow control member group for controlling a flow rate of the processing solution supplied from the liquid supply pipe toward a nozzle or the like.

In arranging these multiple number of control member group in the liquid processing apparatus, there has been a high demand for a compact layout capable of accommodating the control member groups in a relatively small region in order to avoid scale-up of the liquid processing apparatus. To this end, different kinds of control member groups may be arranged close to each other in adjacent regions. By way of example, the gas exhaust pipe may be vertically arranged directly under the liquid processing unit and the flow control member group may be positioned next to the gas exhaust pipe.

Meanwhile, the flow control member group includes a flowmeter or a flow rate control valve provided on a supply pipe for supplying the liquid processing solution.

Accordingly, in arranging individual control member for each supply pipe at a vicinity of a region through which relatively big pipes such as the gas exhaust pipes pass, it may be difficult to secure sufficient working space for arranging the individual control member on each supply pipe. Also, this may be very difficult and cumbersome. Further, after assembling the liquid processing apparatus, it may be also difficult for an operator to have a direct access to the flow control member group in the region blocked by the gas exhaust pipes.

For example, it may be difficult to perform a maintenance work, such as taking out the control member group by stretching the operator's hands to below the liquid processing unit from the opposite side to the gas exhaust pipes. Thus, the maintenance work has imposed a great burden on the operator.

Here, in a liquid processing apparatus described in Patent Document 1, a multiple number of liquid processing units are arranged in a row in a horizontal direction at both sides of a transfer chamber configured to transfer a semiconductor wafer. A set of processing solution pipes, a set of liquid drain pipes and a set of gas exhaust pipes are arranged under each of the liquid processing units. In this liquid processing apparatus, the set of gas exhaust pipes and the set of processing solution pipes are arranged close to each other in adjacent regions, as in other conventional cases. Thus, it would be difficult to perform maintenance work of, e.g., the processing solution pipe group adjacent to the gas exhaust pipe group.

Patent Document 1: Japanese Patent Laid-open Publication No. 2008-034490 (see paragraph [0024] and FIG. 3)

BRIEF SUMMARY OF THE INVENTION

In view of the foregoing, the present disclosure provides a liquid processing apparatus capable of easily performing an assembly and maintenance of the apparatus.

In accordance with one aspect of the present disclosure, there is provided a liquid processing apparatus. The liquid processing apparatus includes multiple liquid processing units, arranged side by side in a horizontal direction, each for performing a liquid process on a substrate by using a processing solution; at least one gas exhaust pipe, extended along an arrangement direction of the liquid processing units and provided below the liquid processing units, for exhausting an atmosphere within each of the liquid processing units; multiple flow control member groups for liquid supply provided below the at least one gas exhaust pipe; at least one liquid supply main pipe for supplying a processing solution into each of the liquid processing units and at least one liquid drain main pipe for draining the liquid processing solution from each of the liquid processing units, the at least one liquid supply main pipe and the at least one liquid drain main pipe being extended along the arrangement direction of the liquid processing units and provided below the flow control member groups; multiple liquid supply branch pipes that are branched from the at least one liquid supply main pipe into each of the liquid processing units and connected with the liquid processing units via the flow control member groups for liquid supply; and multiple liquid drain branch pipes that are branched from the at least one liquid drain main pipe into each of the liquid processing units and connected with the liquid processing units.

In the liquid processing apparatus, a part of the multiple flow control member groups may be accommodated in each housing provided for each of the liquid processing units, and each housing is disposed below the at least one gas exhaust pipe.

Alternatively, all of the multiple flow control member groups may be accommodated in a common housing, and the common housing is disposed below the at least one gas exhaust pipe.

The at least one gas exhaust pipe is plural in number depending on kinds of the processing solutions, and the gas exhaust pipes may be arranged in a horizontal direction.

The at least one liquid supply main pipe is plural in number depending on kinds of the processing solutions, and the liquid supply main pipes may be arranged in a horizontal direction.

The at least one liquid supply main pipe and the at least one liquid drain main pipe may be accommodated in a pipe box.

The at least one liquid supply main pipe and the at least one liquid drain main pipe may be accommodated in a multiple number of pipe boxes, and the pipe boxes are arranged side by side in a horizontal direction.

When a lateral region facing the arrangement of the liquid processing units is set as a main maintenance region, and a lateral region facing the arrangement of the liquid processing units from a position opposite to the main maintenance region via the arrangement of the liquid processing units is set as a sub maintenance region, a part of the flow control member groups corresponding to each of the liquid processing units may be configured to be taken out toward the side of the main maintenance region.

When a lateral region facing the arrangement of the liquid processing units is set as a main maintenance region, and a lateral region facing the arrangement of the liquid processing units from a position opposite to the main maintenance region via the arrangement of the liquid processing units is set as a sub maintenance region, the at least one liquid supply main pipe is plural in number depending on kinds of the processing solutions, and a part of the flow control member groups corresponding to each of the processing solutions may be configured to be taken out toward the side of the main maintenance region.

Moreover, the liquid processing apparatus further includes a clean air supply unit for forming a descending current of clean air within the liquid processing units. Here, the clean gas supply unit may be provided above the liquid processing units and extended along the arrangement direction of the liquid processing units.

In accordance with the present disclosure, under the multiple liquid processing units arranged side by side in the horizontal direction, the gas exhaust pipe extended along the arrangement direction of the liquid processing units; the flow control member group for liquid supply; and the liquid supply main pipe and the liquid drain main pipe respectively extended along the arrangement direction of the liquid processing units are provided in sequence from the top. Accordingly, the flow control member group for liquid supply can be easily intensively arranged, and it becomes easier to work from the lateral side of the arrangement of the liquid processing units. Thus, assembly of the liquid processing apparatus or maintenance of the flow control member group can be easily performed.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
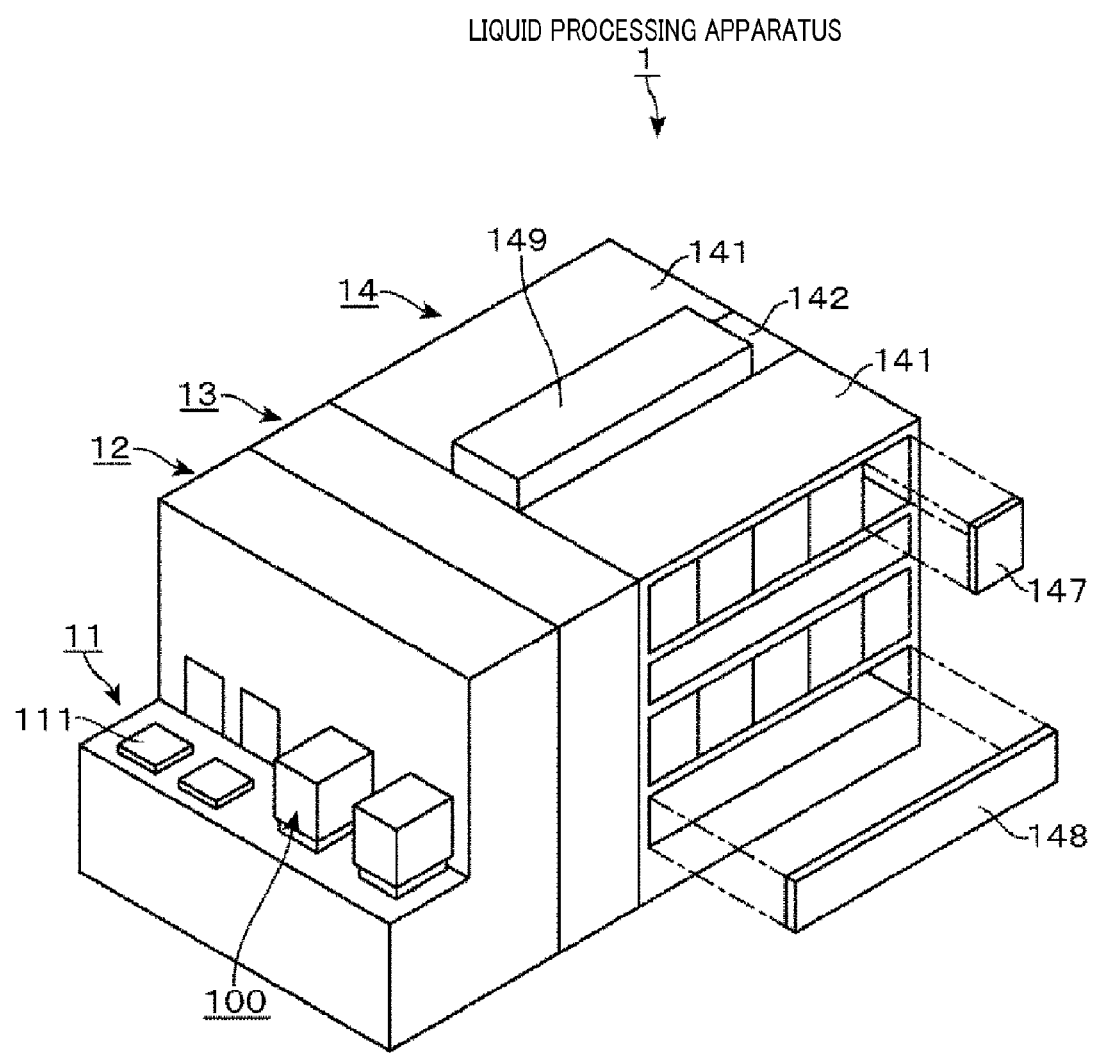
FIG. 1 is a perspective view illustrating an exterior configuration of a liquid processing apparatus in accordance with an embodiment of the present disclosure.

Hereinafter, embodiments of the present disclosure will be described with reference to the accompanying drawings. In an embodiment, the present disclosure is applied to a substrate processing apparatus configured to clean a front surface and a rear surface of a semiconductor wafer (hereinafter, simply referred to as a "wafer"). As illustrated in FIG. 1 showing an exterior perspective view of a liquid processing apparatus 1, and FIGS. 2 and 3 respectively showing a transversal side view and a longitudinal side view of the liquid processing apparatus 1, the liquid processing apparatus 1 may include a mounting block 11, a loading/unloading block 12, a transit block 13 and a liquid processing block 14. The mounting block 11 is configured to mount thereon FOUPs 100 each for accommodating a multiple number of wafers W therein. The loading/unloading block 12 is configured to load and unload the wafers W into and from the FOUPs 100 mounted on the mounting block 11. The transit block 13 is configured to transit the wafer W between the loading/unloading block 12 and the liquid processing block 14 that is located at a rear end of the liquid processing apparatus 1. The liquid processing block 14 is configured to perform a liquid process on the wafer W. If the mounting block 11 is positioned at the front, the mounting block 11, the loading/unloading bock 12, the transit block 13, and the liquid processing block 14 are arranged adjacent to each other in this order from the front side.

The mounting block 11 mounts FOUPs 100 for accommodating therein the multiple wafers W horizontally on mounting tables 111. The loading/unloading block 12 serves to transfer the wafer W, and the transit block 13 serves to transit the wafer W. Each of the loading/unloading block 12 and the transit block 13 is embedded in a housing.

The loading/unloading block 12 includes a first wafer transfer device 121. The first wafer transfer device 121 includes a transfer arm 122 for holding a wafer W thereon; and a device for moving the transfer arm 122 back and forth. The first wafer transfer device 121 further includes a device configured to move along a horizontal guide 123 (see FIG. 2) elongated in an arrangement direction of the FOUPs 100; a device configured to move along a vertical guide 124 (see FIG. 3) elongated in a vertical direction; and a device configured to rotate the transfer arm 122 on a horizontal plane. The wafer W is transferred by the first wafer transfer device 121 between the FOUPs 100 and the transit block 13. In FIG. 3, a reference numeral 125 denotes a FFU (Fan Filter Unit) for supplying clean air into a space within the loading/unloading block 12.

The transit block 13 includes a transit shelf 131 for mounting the wafer W thereon. The wafer W is transferred between transfer devices of the loading/unloading block 12 and the liquid processing block 14 (i.e., between the aforementioned first wafer transfer device 121 and a second wafer transfer device 143 to be described later) via the transit shelf 131.

The liquid processing block 14 is configured to include a liquid processing section 141 and a transfer section 142 that are provided in a housing. Multiple liquid processing units 2 are disposed in the liquid processing section 141, and the wafer W is transferred in the transfer section 142. Accommodated under each liquid processing unit within the liquid processing section 141 are a supply system for supplying a processing solution to each liquid processing unit, a drain system for draining the processing solution and a gas exhaust system for exhausting a gas including vapor of the processing solution. Detailed configuration thereof will be described later.

The transfer section 142 has the second wafer transfer device 143 in a space elongated in a forward/backward direction from a connection part to the transit block 13 as a base. The second wafer transfer device 143 includes a transfer arm 144 for holding thereon the wafer W and a device for moving the transfer arm 144 back and forth. The second wafer transfer device 143 further includes a device configured to move along a horizontal guide 145 (see FIG. 2) elongated in the forward/backward direction; a device configured to move along a vertical guide 146 (see FIG. 4) elongated in a vertical direction; and a device configured to rotate the transfer arm 144 on a horizontal plane. The wafer W can be transferred by the second wafer transfer device 143 between the transit shelf 131 and each liquid processing unit 2. A reference numeral 149 shown in FIGS. 1, 3, and 4 denotes a FFU configured to supply clean air into the space within the liquid processing block 14.

Figure 2:
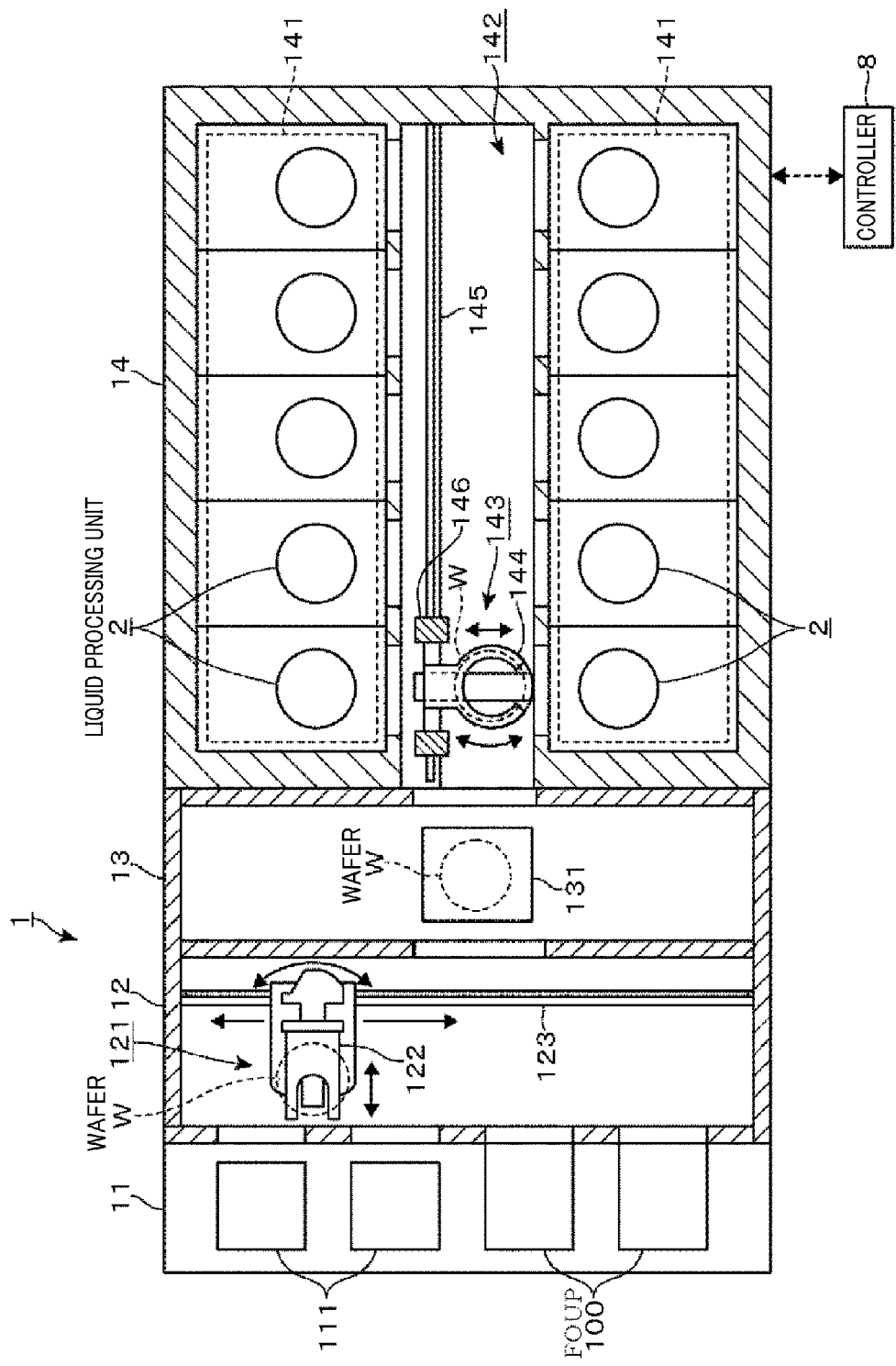
FIG. 2 is a transversal plane view of the liquid processing apparatus.
Figure 3:
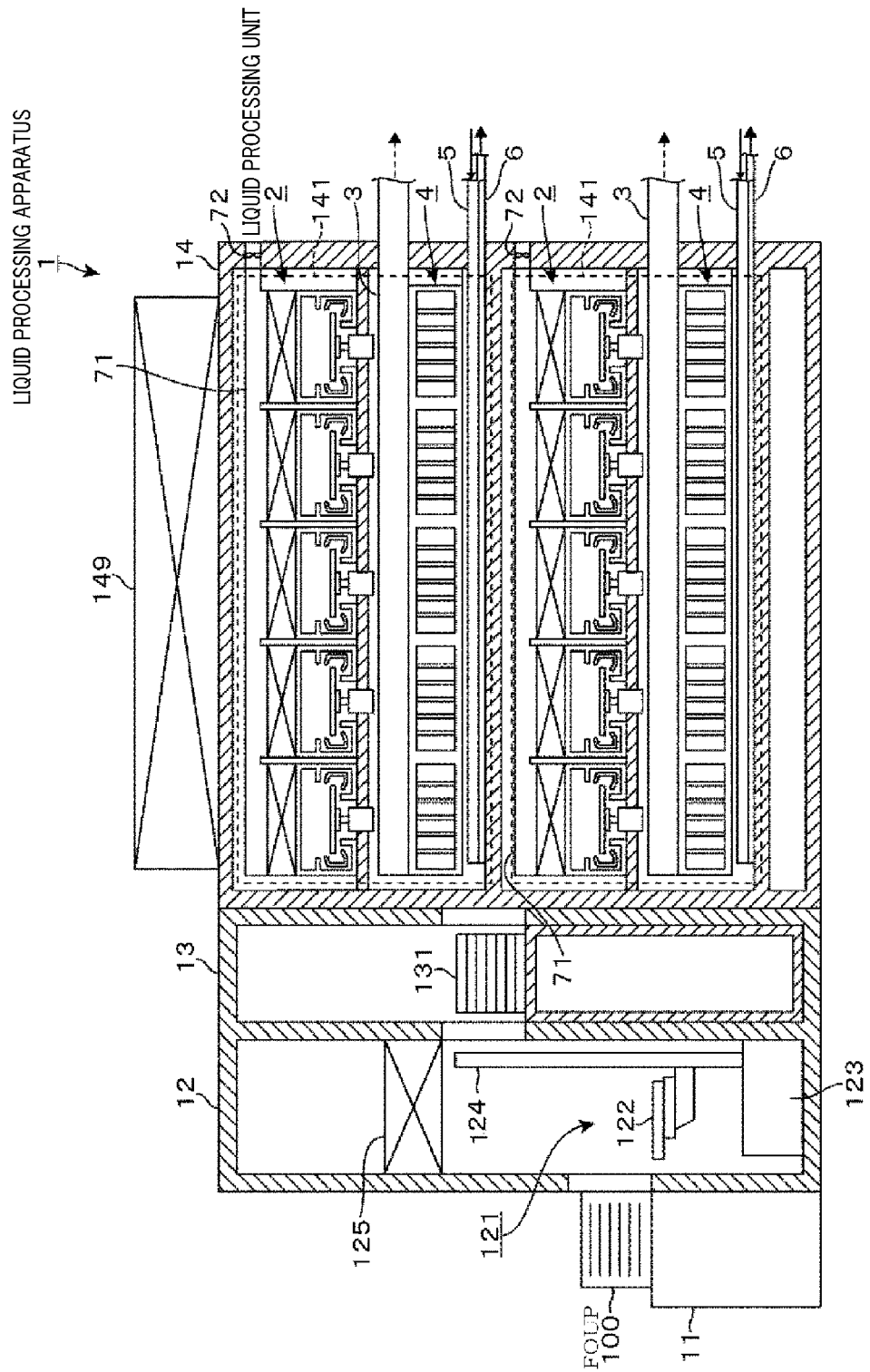
FIG. 3 is a longitudinal side view of the liquid processing apparatus when viewed from a side direction.
Figure 4:
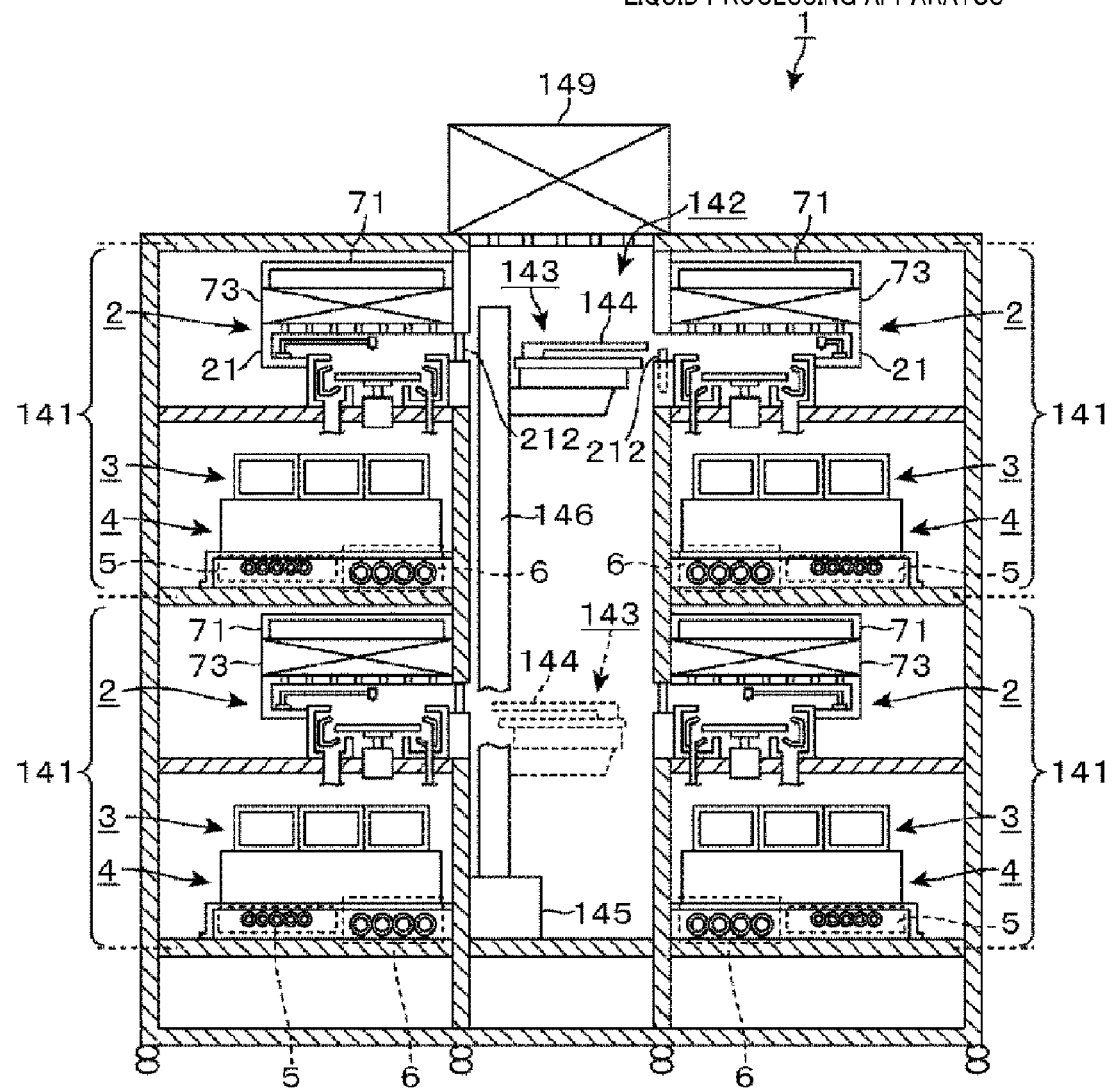
FIG. 4 is a longitudinal side view of the liquid processing apparatus when viewed from a front direction.

As depicted in FIGS. 2 and 3, in the liquid processing section 141, multiple, e.g., five liquid processing units 2 are horizontally arranged adjacent to each other in a direction along which the space forming the transfer section 142 is elongated. As depicted in FIG. 4 showing a longitudinal side view of the liquid processing apparatus 1 when viewed from a front direction, liquid processing sections 141 provided at the left and right sides of the transfer section 142 are vertically arranged in two levels. In total, four liquid processing sections 141 are provided. Accordingly, the total number of the liquid processing units 2 provided in the liquid processing apparatus 1 in accordance with the present embodiment is twenty.

A configuration of the liquid processing unit 2 in each liquid processing section 141 will be explained with reference to FIG. 5. The liquid processing unit 2 is configured as a single-wafer processing unit that performs a liquid process on wafers W sheet by sheet by a spin process. The liquid processing unit 2 includes a rotary plate 24, a rotation shaft 251, a liquid supply pipe 252, a liquid supply nozzle 26, an inner cup 23 and an outer cup 22. The rotary plate 24 holds a wafer W thereon. The rotation shaft 251 supports the rotary plate 24 from a bottom surface thereof and is configured to rotate the rotary plate 24 by a non-illustrated rotation motor. The liquid supply pipe 252 is inserted through the rotation shaft 251 so as to supply a processing solution to a rear surface of the wafer W. The liquid supply nozzle 26 is configured to supply a processing solution to a front surface of the wafer W. The inner cup 23 is configured to receive a liquid chemical scattered from the wafer W being rotated, and then, discharge the received liquid chemical to the outside. The outer cup 22 accommodates the rotary plate 24 or the inner cup 23 therein, and is configured to exhaust an atmosphere within the liquid processing unit 2.

The rotary plate 24 is a circular plate-shaped member having an opening at a center thereof. A multiple number of holding members 241 for holding the wafer W are provided on a surface of the rotary plate 24. The wafer W is held on the holding members 241 so as to be located at a position higher than the surface of the rotary plate 24 with a gap maintained between the rotary plate 24 and the wafer W. A processing solution supplied from the liquid supply pipe 252 through the central opening of the rotary plate 24 is dispersed over the entire rear surface of the wafer W through the gap.

The rotation shaft 251 is rotatably held on a bearing 253 provided on a base plate 27 within the liquid processing section 141.

A supporting pin (not shown) for supporting the wafer W from the rear surface thereof is provided on an upper end surface of the liquid supply pipe 252. Further, a non-illustrated elevation device configured to move the liquid supply pipe 252 up and down is provided at a lower end of the liquid supply pipe 252. By moving up and down the liquid supply pipe 252, the liquid supply pipe 252 can be protruded from or retracted into the central opening of the rotary plate 24. As the liquid supply pipe 252 is moved in this way, the wafer W can be moved up and down, while being held on the supporting pin, between a transfer position where the wafer W is transferred from/to the transfer arm 144 and a processing position on the rotary plate 24.

The liquid supply pipe 252 is connected with a rear surface liquid supply line 472 for supplying an alkaline processing solution such as SC1 solution (mixed solution of ammonia and oxygenated water) or an acid processing solution such as DHF (Diluted HydroFluoric acid), and a rinse solution such as DIW (DeIonized Water).

Meanwhile, the liquid supply nozzle 26 for supplying the liquid chemical to the front surface of the wafer W is supported by a nozzle arm 261, and is configured to be moved between a processing position above the wafer W held on the rotary plate 24 and a retreated position from this processing position. The liquid supply nozzle 26 is connected with a nozzle liquid supply line 471 for supplying an organic solvent such as IPA (IsoPropyl Alcohol) for use in a drying process as well as the alkaline or the acid solution, and the rinse solution.

The inner cup 23 is a circular ring-shaped member surrounding the wafer W held on the rotary plate 24. A processing solution received in the inner cup 23 is discharged through a liquid drain pipe 65 connected to a bottom surface of the inner cup 23. The outer cup 22 serves to exhaust an introduced air current from a gap between the inner cup 23 and the outer cup 22. A gas exhaust line 36 is connected to a bottom surface of the outer cup 22. Further, openings are formed above the outer cup 22 and the inner cup 23, and the diameters thereof are larger than the diameter of the wafer W. The wafer W supported on the liquid supply pipe 252 may be moved up and down through these openings.

A casing 21 is provided on the outer cup 22 so as to cover the opening of the outer cup 22. As depicted in FIG. 4, an opening/closing door 212 is provided on a side surface of the outer cup 22 in contact with the transfer section 142. The transfer arm 144 can enter the liquid processing unit 2 after the opening/closing door 212 is opened.

A filter unit 73 is disposed on the casing 21. The filter unit 73 is connected with an air supply duct 71 elongated in the arrangement direction of the liquid processing units 2 (see FIGS. 3 to 5). A fan unit 72 is provided at an upstream end of the air supply duct 71, e.g., at a lateral side of the housing accommodating the liquid processing block 14. An air current introduced from the fan unit 72 is flown into the casing 21 via the filter unit 73. As described above, by locating the fan unit 72 at a lateral side of each liquid processing unit 2, the height of the liquid processing unit 2 can be reduced. Further, by providing a common fan unit 72 for multiple liquid processing units 2, cost can be decreased as compared to a case where a FFU is installed at each liquid processing unit 2. Here, a reference numeral 211 shown in FIG. 5 denotes an air supply hole through which clean air is supplied into the casing 21 from the filter unit 73.

The liquid processing apparatus 1 including the multiple liquid processing units 2 in accordance with the present disclosure as described above may be characterized by a pipe group or a flow control member group of a power supply system provided to solve the aforementioned prior art problems in installation or maintenance of the apparatus. A detailed configuration thereof will be described as follows.

As illustrated in FIGS. 3 and 4, under the arrangement of the multiple liquid processing units 2 in each liquid processing section 141, a gas exhaust pipe 3, a flow control block 4, a liquid supply main pipe 5, and a liquid drain main pipe 6 are arranged sequentially from the top. The gas exhaust pipe 3 is configured to exhaust an atmosphere within each liquid processing unit 2. The flow control block 4 accommodates therein a liquid supply flow control member group 402 for adjusting, e.g., a supply amount of a processing solution supplied to the liquid processing unit 2. The liquid supply main pipe 5 serves to supply the processing solution to the liquid processing unit 2. The liquid drain main pipe 6 drains the processing solution from the liquid processing unit 2. In this way, since the respective pipe groups or control member group having the same functions are collectively located at the same height positions, it is possible to intensively arrange the pipe groups or control member group. Further, it may become easier for an operator to perform a maintenance work at a maintenance region that is provided at the lateral side of the arrangement of the liquid processing units 2, as will be described later.

Figure 7:
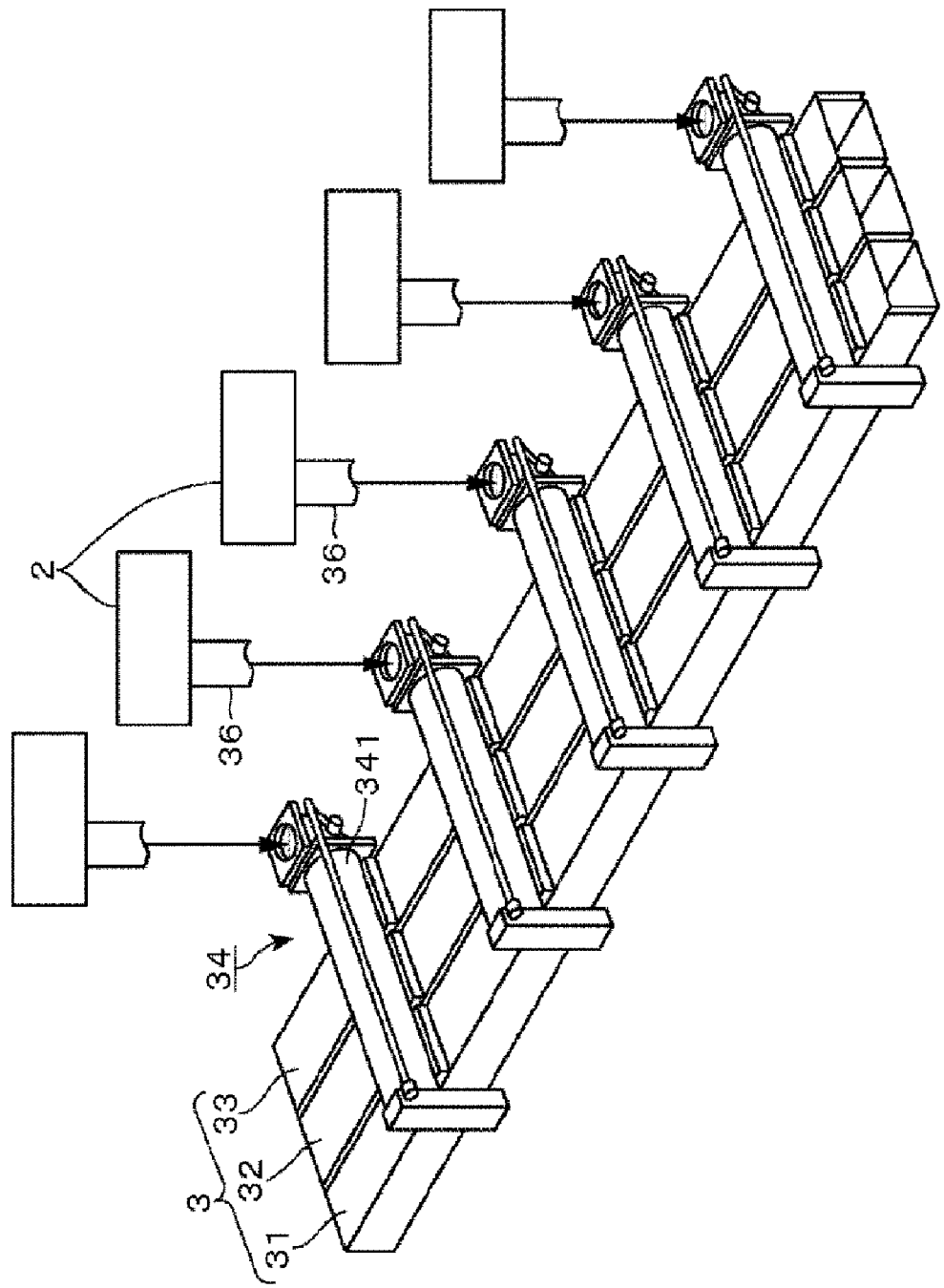
FIG. 7 is an explanatory diagram illustrating a state in which the gas exhaust pipe is connected to the liquid processing unit.

The gas exhaust pipe 3 includes an acid gas exhaust pipe 31 for gas exhaust during a process with an acid processing solution; an alkaline gas exhaust pipe 32 for gas exhaust during a process with an alkaline processing solution; and an organic gas exhaust pipe 33 for gas exhaust during a process with an organic processing solution such as IPA. As shown in FIGS. 3 and 7, the gas exhaust pipe 3 (31, 32, 33) is arranged under the multiple liquid processing units 2 so as to be elongated along the arrangement direction of the liquid processing units 2. Further, as depicted in FIG. 7, the three gas exhaust pipes 31 to 33 are arranged side by side in a horizontal direction. The gas exhaust pipes 31, 32, and 33 are connected with waste gas scrubbers for processing the acid gas, the alkaline gas, and the organic gas, respectively.

Figure 8:
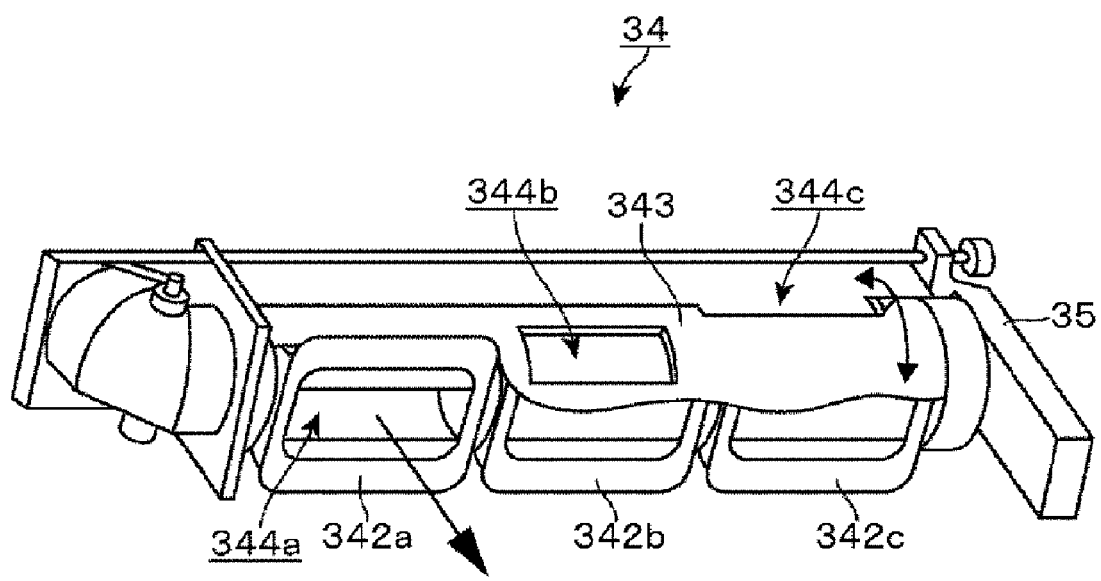
FIG. 8 is a perspective view illustrating a configuration of a flow path switching unit provided at a part of the gas exhaust pipe.

In this embodiment, the gas exhaust pipes 31 to 33 are connected with the gas exhaust line 36 of each liquid processing unit 2 via a flow path switching unit 34 for switching gas exhaust paths. As shown in FIGS. 7 and 8, the flow path switching unit 34 has a dual cylinder structure including an outer cylinder 341 and a rotary cylinder 343. The flow path switching unit 34 is connected with the gas exhaust pipes 31 to 33 via flanges 342a to 342c provided at the outer cylinder 341, respectively. One end of the rotary cylinder 343 is connected with the gas exhaust line 36 of the liquid processing unit 2, while the other end of the rotary cylinder 343 is connected with a rotation driving unit 35 so that the rotary cylinder 343 can be rotated with respect to a central axis. Moreover, openings 344a to 344c opened toward different diametric directions are formed at side surface of the rotary cylinder 343. The openings 344a to 344c correspond to the flanges 342a to 342c. By rotating one of the openings 344a to 344c so as to communicate with one of the flanges 342a to 342c, the gas exhaust pipe 31, 32 or 33 through which gas exhaust would be performed can be selected.

As described above, among the pipes 3, 5, and 6 of the power supply system, the gas exhaust pipe 3 is located at a position closest to the liquid processing unit 2. In this configuration, pressure loss can be suppressed, and an exhaust amount allotted to the liquid processing apparatus 1 in the overall exhaust capacity of a factory can be reduced.

Figure 6:
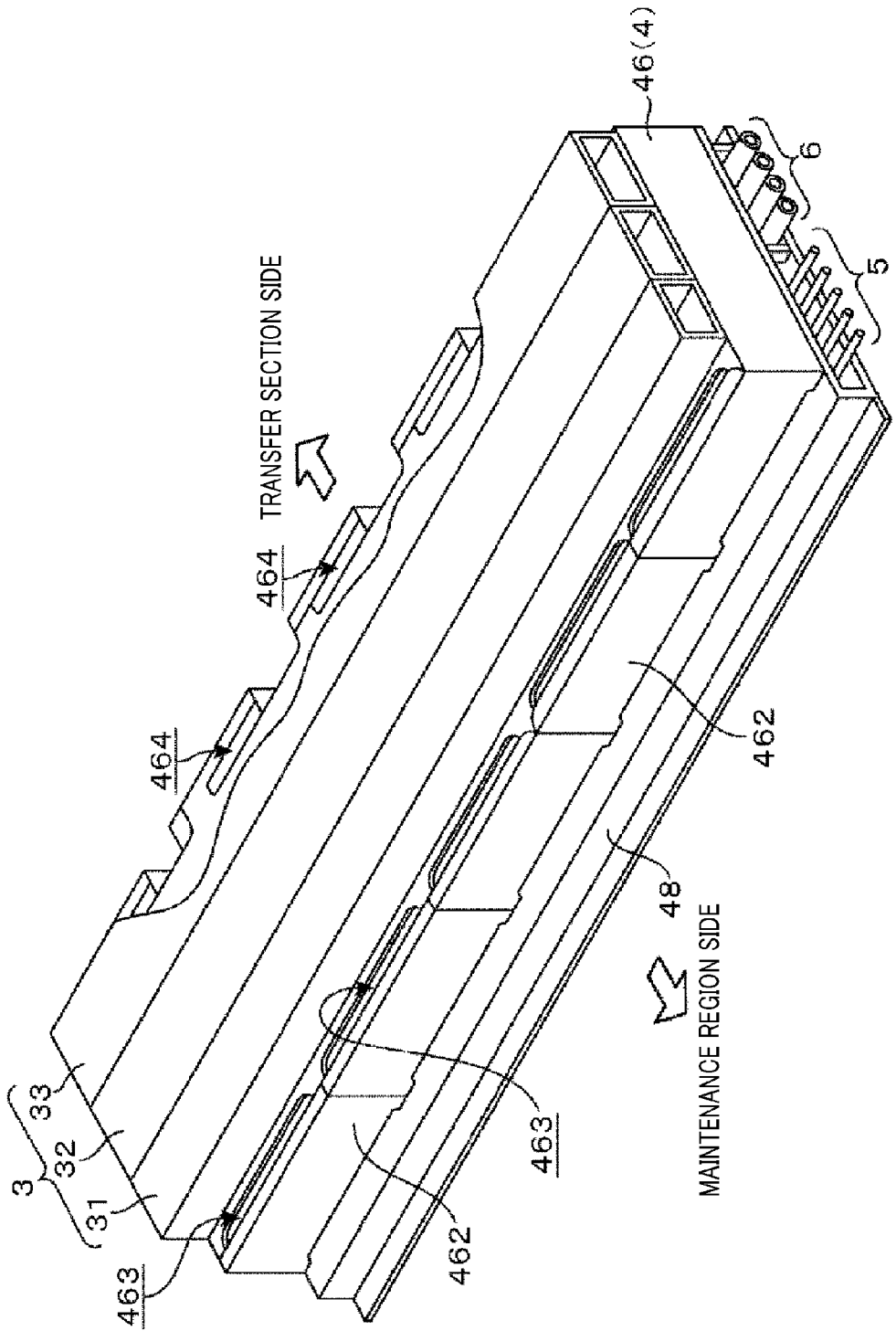
FIG. 6 is a perspective view showing an exterior configuration of a gas exhaust pipe and a flow control block provided in the liquid processing apparatus.

As shown in FIGS. 3 and 6, the flow control block 4 accommodating therein the flow control member group 402 is disposed below the gas exhaust pipe 3. The flow control block 4 is accommodated in a common base body, e.g., a housing (a housing body 46), and the housing body 46 is provided below the gas exhaust pipe 3. A detailed inside configuration thereof will be explained later.

Further, a pipe box 48 is located under the housing body 46. Accommodated in the pipe box 48 are multiple liquid supply main pipes 5 and multiple liquid drain main pipes 6 that are elongated along the arrangement direction of the liquid processing units 2. As illustrated in FIGS. 4 and 6, these multiple number of main pipes 5 and 6 are arranged together for their purposes such as liquid supply and liquid drain, and arranged side by side in the horizontal direction. A pipe group of the liquid supply main pipes 5 is disposed at a position close to an outer wall surface of the liquid processing block 14. Further, a pipe group of the liquid drain main pipes 6 is disposed at a position close to the transfer section 142, which is an inner side of the liquid processing block 14 when viewed from the outer wall surface thereof. A lateral region of the outer wall surface of the liquid processing block 14 corresponds to a maintenance region to be described later.

Figure 5:
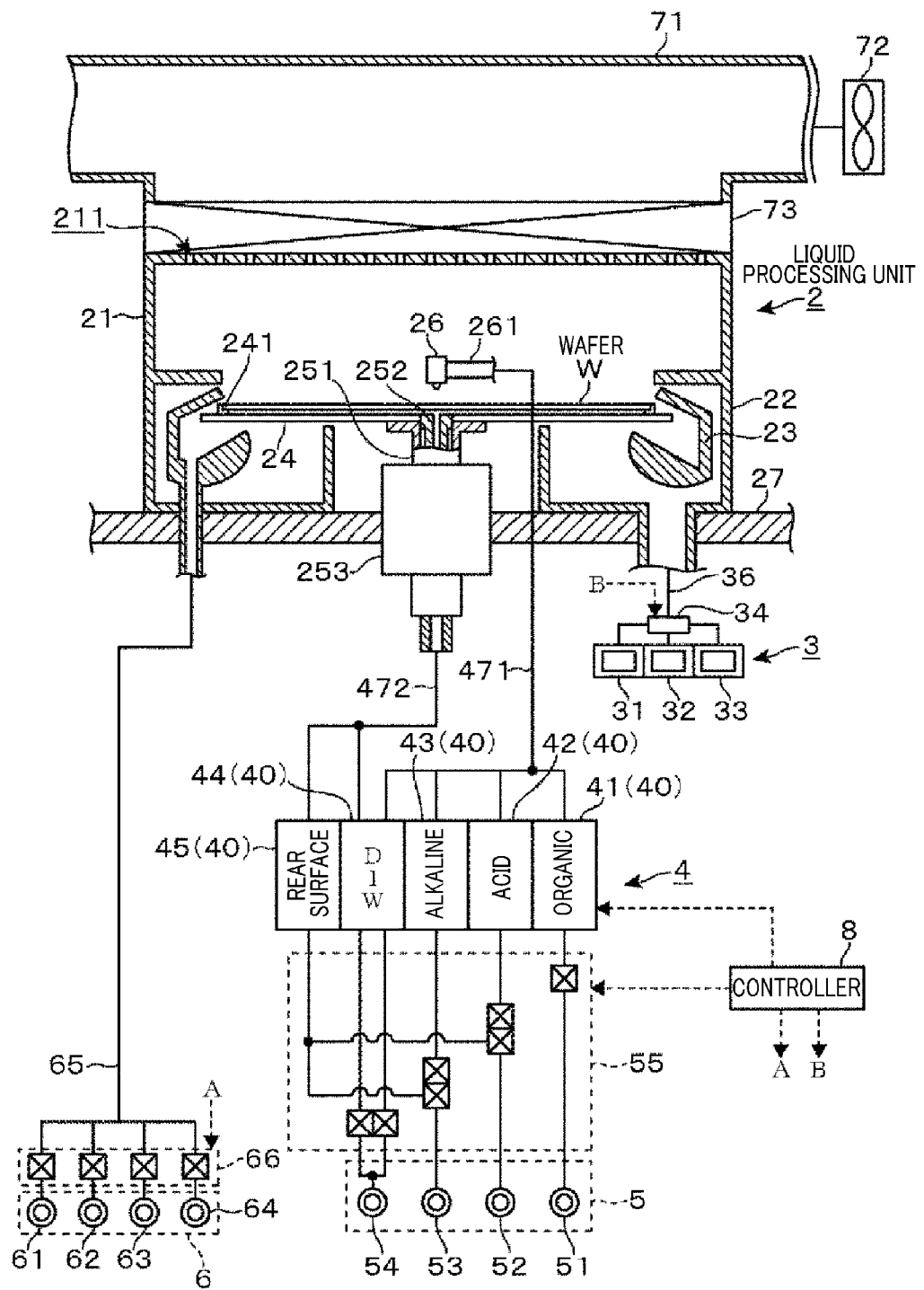
FIG. 5 is a longitudinal side view of a liquid processing unit provided in the liquid processing apparatus.

As depicted in FIG. 5, the liquid supply main pipe 5 includes an alkaline liquid supply main pipe 53 for supplying an alkaline processing solution, a DHF supply main pipe 52 for supplying an acid processing solution, a DIW supply main pipe 54 for supplying a rinse solution, an IPA supply main pipe 51 for supplying IPA for a drying process, and the like. The liquid supply main pipes 51 to 54 are connected with supply tanks or supply pumps (not shown) for the respective processing solutions. Since a pressure of a liquid is increased by a pump or the like, there may be little disadvantage in supplying the liquid processing solutions even if the liquid supply main pipes 51 to 54 are located at positions far from the liquid processing unit 2, as compared to the gas exhaust pipe 3.

The liquid supply main pipes 51 to 54 are connected with the liquid supply nozzle 26 and the liquid supply pipe 252 provided at each liquid processing unit 2 via opening/closing valves 55, the flow control block 4, and the nozzle liquid supply line 471 or the rear surface liquid supply line 472. Pipes branched from the liquid supply main pipes 51 to 54 and provided with the opening/closing valves 55; a pipe group within the flow control block 4; the nozzle liquid supply line 471; and the rear surface liquid supply line 472 correspond to a "liquid supply branch pipe" in the present disclosure.

Further, the liquid drain main pipe 6 includes an alkaline liquid drain main pipe 62 for draining the alkaline processing solution; an acid liquid drain main pipe 61 for draining the acid processing solution; a water drain main pipe 64 for draining water such as the rinse solution; an organic liquid drain main pipe 63 for draining the organic processing solution, and the like. Each of the liquid drain main pipes 61 to 64 is connected with a liquid drain processing device, a processing solution collection tank (not shown) or the like. Further, the liquid drain main pipes 61 to 64 are connected with the liquid drain pipe 65 of the liquid processing unit 2 via opening/closing valves for switching liquid drain paths. Since the various kinds of liquids are discharged into the liquid drain main pipes 61 to 64 simply by being dropped from the liquid processing unit 2, there will be little disadvantage in discharging the processing solutions even if the liquid drain main pipes 61 to 64 are located at positions far from the liquid processing unit 2, as compared to the gas exhaust pipe 3. A group of pipes branched from the liquid drain main pipes 61 to 64 and provided with the opening/closing valves 66 or the liquid drain pipe 65 corresponds to a "liquid drain branch pipe" in the present disclosure.

Figure 9:
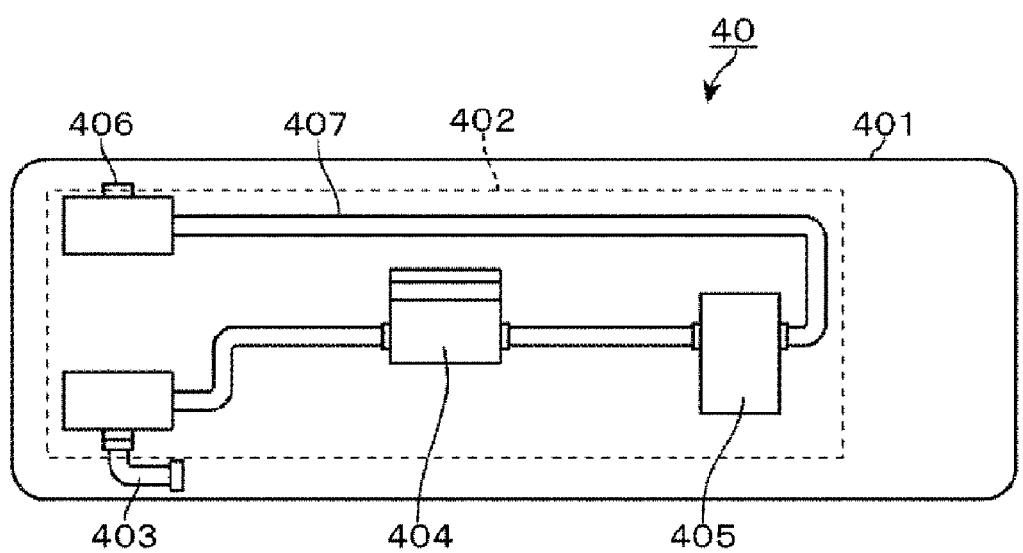
FIG. 9 is a side view illustrating a configuration of a flow control unit provided in the flow control block.

Now, the flow control block 4 accommodated in the housing body 46 will be explained. The flow control block 4 includes a multiple number of flow control units 40 accommodated in the common housing body 46. Each flow control unit 40 is configured to control, e.g., a flow rate of a processing solution supplied into the liquid supply nozzle 26 or the liquid supply pipe 252 of each liquid processing unit 2 depending on a kind of the processing solution or depending on liquid supply paths of the processing solution. The flow control unit 40 may have various configurations depending on the kinds or liquid supply paths of processing solution. FIG. 9 shows a common configuration example for the flow control units 40 provided in the flow control block 4 in accordance with the present embodiment.

Each flow control unit 40 includes a flow control member group 402 provided on a supporting plate 401 serving as a supporting member. The flow control member group 402 includes a flowmeter 404 for measuring a flow rate of a processing solution; a flow rate control valve 405 for controlling the flow rate of the processing solution; and a pipe 407 for connecting the flow meter 404 and the flow rate control valve 405. The flow control member group 402 is provided on a part of a pipe (mentioned as the "supply pipe" in the description of the flow control block 4) that is branched from the liquid supply main pipe 5 (51 to 54) and downwardly extended to below the liquid processing unit 2 in order to supply the processing solution toward the liquid supply nozzle 26 or the liquid supply pipe 252. The flow control member group 402 is configured to control, e.g., a flow rate or a supply timing of the processing solution. However, the configuration of the flow control unit 40 may not be limited to the above-described example, and the flow control unit 40 may include another type of a flow controller such as a bypass pipe besides the opening/closing valve 55 shown in FIG. 5.

Figure 10:
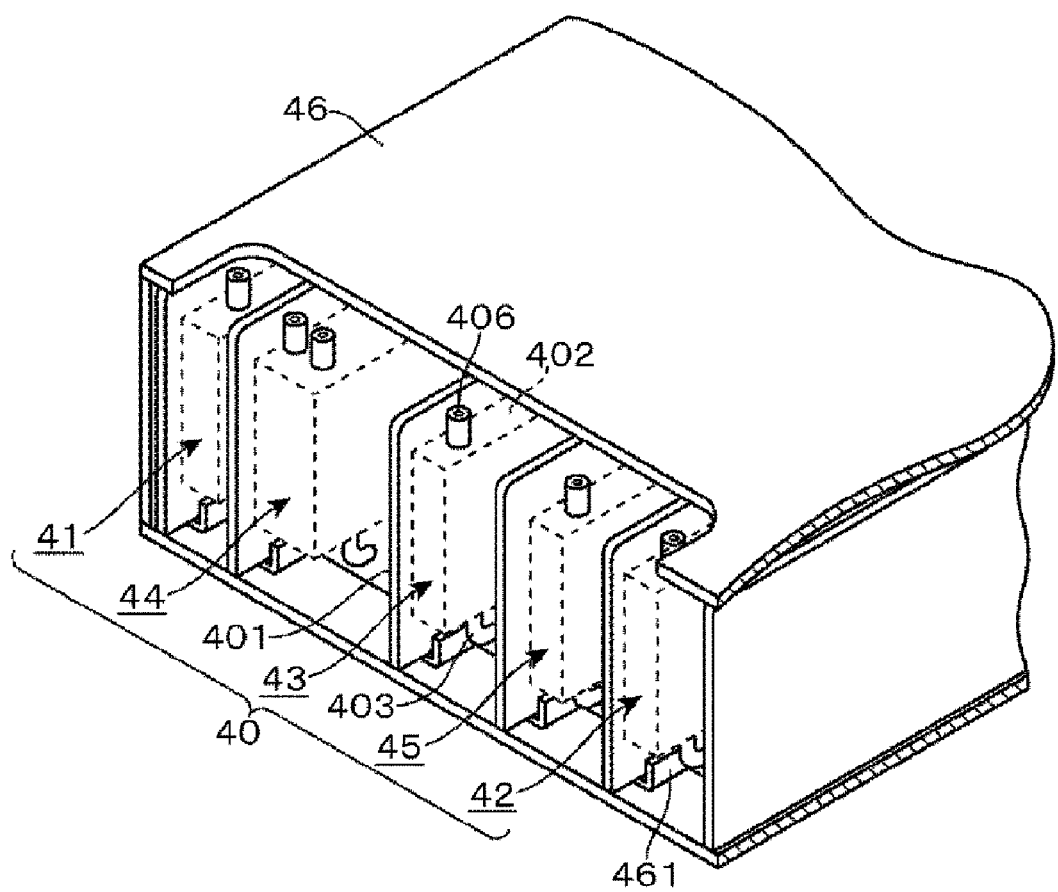
FIG. 10 is a perspective view illustrating a state in which the flow control unit is accommodated in a housing body.
Figure 11:
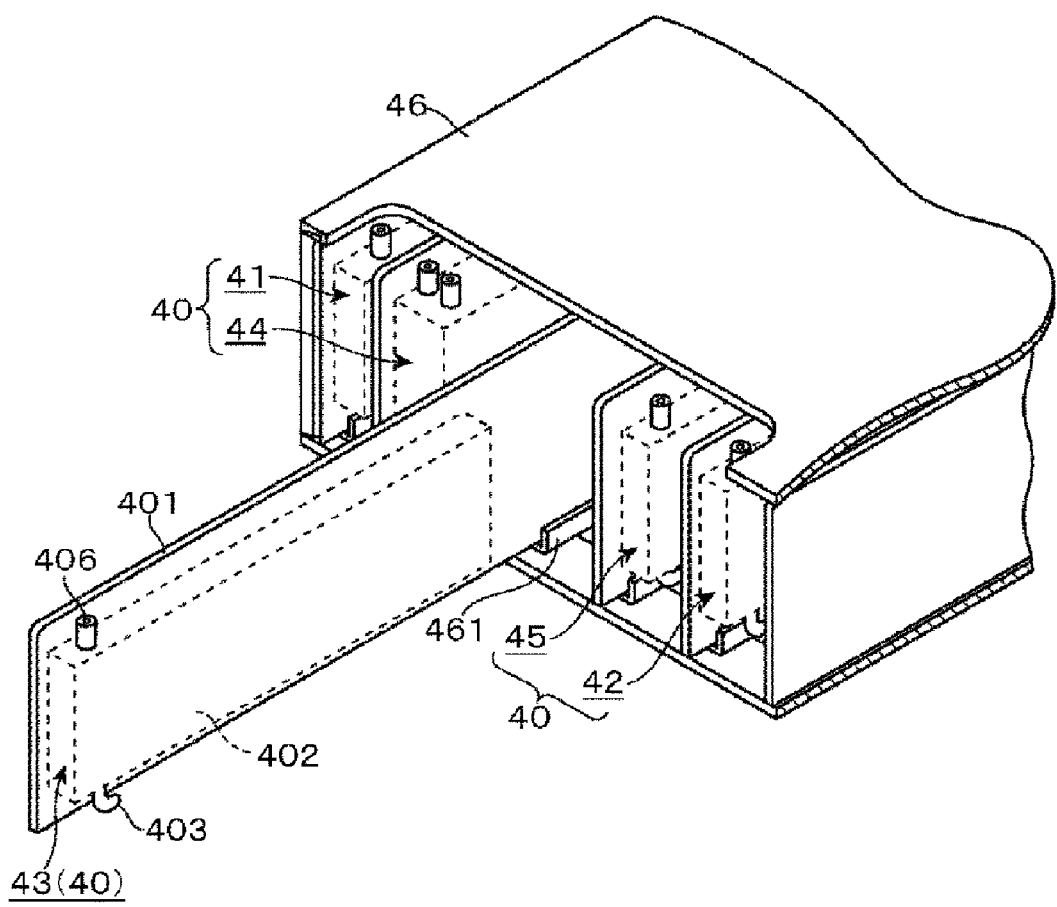
FIG. 11 is a perspective view illustrating a state in which the flow control unit is taken out from the housing body.

As illustrated in FIGS. 10 and 11, the multiple flow control units 40 are accommodated in the housing body 46 for the liquid processing unit 2. Each flow control unit 40 may be held by holding members 461 provided at a top surface and a bottom surface of the housing body 46 such that the supporting plate 401 is supported in an upright position. Further, it may be possible to take out the whole flow control unit 40 from the housing body 46.

Here, as illustrated in FIG. 1, a separable cover body 148 is provided on each of the left and right sidewall surfaces of the liquid processing section 141 at a height where the flow control block 4 is located. By separating the cover bodies 148, it may be possible to access the housing body 46 of each liquid processing section 141 and to allow the flow control unit 40 to become opened. In the present embodiment, an inner cover 462 is provided on a side surface of the housing body 46 to correspond to the liquid processing unit 2. If the inner cover 462 is separated, multiple flow control units 40 of the corresponding liquid processing unit 2 are arranged side by side in the horizontal direction (see FIGS. 10 and 11). To elaborate, a set of flow control units 40 may be provided for each liquid processing unit 2. Further, within the housing body 46, every set of flow control units 40 may be arranged side by side in the horizontal direction so as to be located under the corresponding liquid processing unit 2 to which the processing solution is to be supplied. Hereinafter, a lateral region that is provided to allow the operator to access the flow control unit 40 and faces the arrangement of the liquid processing units 2 in the liquid processing apparatus 1 will be referred to as a "main maintenance region".

Here, a reference numeral 147 shown in FIG. 1 denotes a separable cover body that can be separated from a sidewall portion of the liquid processing section 141 and is provided at a position where each liquid processing unit 2 is located.

Figure 12:
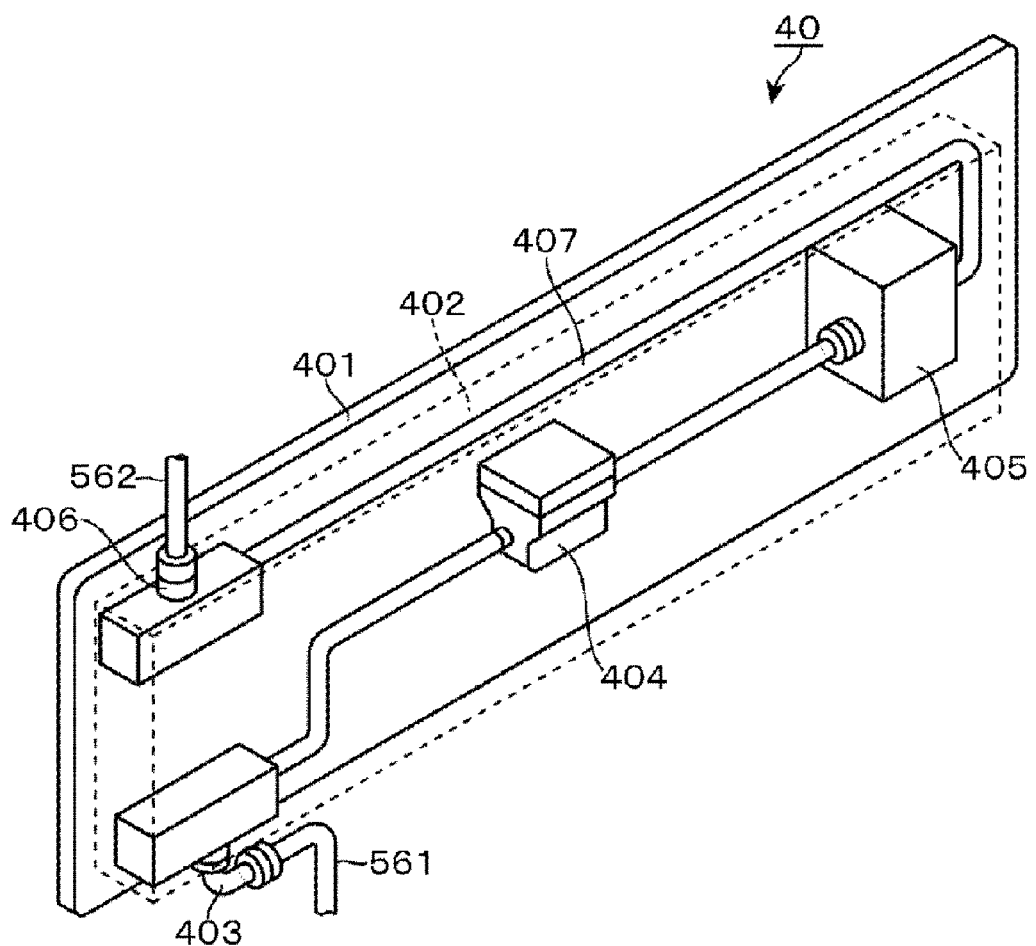
FIG. 12 is a perspective view illustrating a state in which the flow control unit is connected to a supply pipe.
Figure 13:
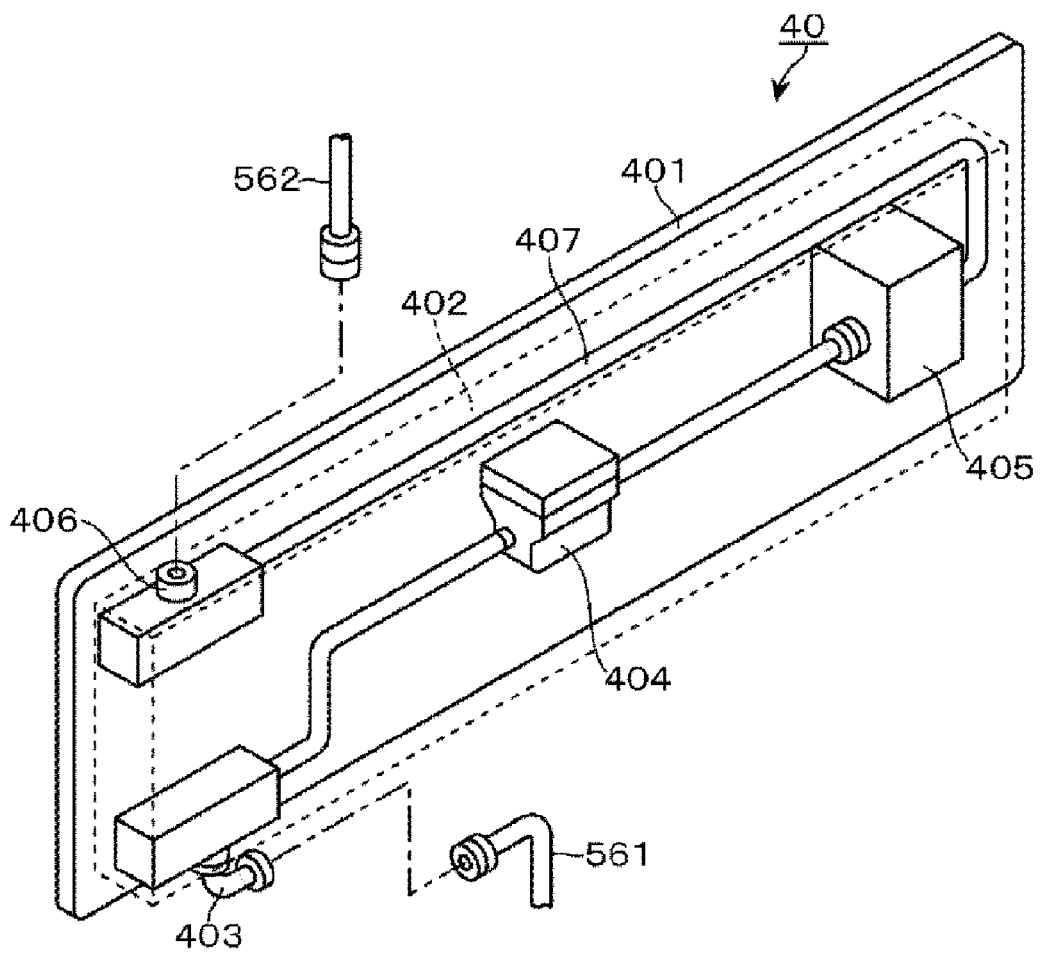
FIG. 13 is a perspective view illustrating a state in which flow control unit is separated from the supply pipe.

The flow control member group 402 of each flow control unit 40 is detachably connected to an upstream liquid supply pipe (indicated as an upstream supply pipe 561 in FIGS. 12 and 13) located at an upstream of the flow control unit 40 via an upstream port 403. Further, the flow control member group 402 is also detachably connected to a downstream liquid supply pipe (indicated as a downstream supply pipe 562 in FIGS. 12 and 13) located at an downstream of the flow control unit 40 via an downstream port 406. The upstream supply pipe 561 corresponds to each of the respective pipes from the liquid supply main pipe 5 (51 to 54) to the flow control unit 40 (41 to 45). The downstream supply pipe 562 corresponds to the nozzle supply line 471 from the flow control unit 40 (41 to 45) to the liquid supply nozzle 26 and the rear surface liquid supply line 472 from the flow control unit 40 (41 to 45) to the liquid supply pipe 252.

As shown in FIGS. 10 and 11, the upstream port 403 and the downstream port 406 are provided at a bottom side and a top side of an arrangement region of the flow control member group 402, respectively, so as to be close to the main maintenance region provided at a direction in which the flow control unit 40 is taken out. Accordingly, it may be possible to easily access the upstream port 403 and the downstream port 406 from the main maintenance region. Further, the flow control unit 40 can be easily detached and attached during a maintenance work. As described, the flow control units 40 each having precision devices such as the flowmeter 404 and the flow rate control valve 405 that requires periodic maintenance are provided at the side of the main maintenance region.

Further, as depicted in FIG. 6, formed on a top surface of the housing body 46 at the side of the main maintenance region are liquid supply pipe installation openings 463. The downstream supply pipe 562 is connected with the downstream port 406, and is upwardly extended toward the liquid processing unit 2 through the liquid supply pipe installation opening 463. These downstream supply pipes 562 are connected with the liquid supply nozzle 26 or the liquid supply pipe 252 via the lateral side of the gas exhaust pipe 3. Further, a lateral region (region at the side of the transfer section 142 in the liquid processing apparatus 1 in accordance with the present embodiment) facing the liquid processing units 2 from a position opposite to the main maintenance region with the arrangement of the liquid processing units 2 may be referred to as a "sub maintenance region". The liquid drain pipe 65 through which a used processing solution is discharged is connected with the liquid drain main pipe 6 below the flow control block 4 via liquid drain pipe installation openings 464 at the side of the sub maintenance region. As in this configuration, the liquid drain pipe 65 that does not require frequent maintenance may be disposed at the opposite side to the main maintenance region. If necessary, maintenance may be performed by accessing the liquid drain pipe 65 from the side of the transfer section 142 serving as the sub maintenance region. In the present embodiment, since the liquid drain pipe 65 does not have a precision device such as a flowmeter or a flow rate control valve, it may not be necessary to separate the liquid drain pipe 65 for replacement or maintenance thereof as long as there does not occur a problem such as damage of a main body of the liquid drain pipe 65 or the opening/closing valves 66. Thus, the liquid drain pipe 65 or the opening/closing valves 66 are fixed to the pipe box 48 or the like.

The kind of the flow control unit 40 having the above-described configuration, and a connection state between the flow control unit 40 and the liquid processing unit 2 will be explained with reference to FIG. 5. An IPA control unit 41 controls a flow of IPA (organic solvent) supplied into the liquid supply nozzle 26 from the IPA supply main pipe 51. A DHF control unit 42 controls a flow of an acid processing solution (DHF) supplied into the liquid supply nozzle 26 from the DHF liquid supply main pipe 52. Further, an alkaline liquid control unit 43 controls a flow of an alkaline processing solution supplied into the liquid supply nozzle 26 from the alkaline liquid supply main pipe 53.

A DIW control unit 44 includes, e.g., two sets of flow control member groups 402. Therefore, the DIW control unit 44 controls a flow of the DIW supplied from the DIW supply main pipe 54 into the liquid supply nozzle 26 and the liquid supply pipe 252. Further, a rear surface supply control unit 45 is configured to supply into the liquid supply pipe 252 either one of the acid processing solution and the alkaline processing solution from the DHF liquid supply main pipe 52 and the alkaline liquid supply main pipe 53.

As illustrated in FIGS. 2 and 5, the liquid processing apparatus 1 having the configuration as described above is connected with a controller 8. The controller 8 includes a computer (not shown) having, e.g., a CPU and a storage unit. The storage unit stores therein programs including control steps (commands) for controlling operations of the liquid processing apparatus 1, i.e., processes for taking out a wafer W from the FOUP mounted on the mounting block 11; transferring the wafer W into each liquid processing unit 2; performing a liquid process, drying process or the like; and returning the processed wafer W back into the FOUP. These programs are stored in a storage medium such as a hard disk, a compact disk, a magneto-optical disk, or a memory card, and may be installed on the computer by being retrieved from the storage medium. As illustrated in FIG. 5, specifically, the controller 8 may output control signals to the various switching valves 34, 55, and 66 or the control members within the flow control units 40. Further, the controller 8 may control supply timing or supply amounts of the processing solutions; and switch liquid drain paths of the processing solutions or gas exhaust paths of processing atmospheres.

An operation of the liquid processing apparatus 1 having the above-described configuration will be briefly explained. First, a single wafer W is taken out from the FOUP 100 mounted on the mounting block 11 by the first wafer transfer device 121, and then, is loaded on the transit shelf 131. This operation is repetitively performed. Wafers W loaded on the transit shelf 131 are transferred in the transfer section 142, and then, loaded into one of the liquid processing units 2 one by one by the second wafer transfer device 143.

In the liquid processing unit 2, liquid processes are performed as follows. Various kinds of liquid chemicals are supplied onto the wafer W while the wafer W is being rotated and particles or organic contaminants caused by an alkaline liquid chemical are removed; a rinsing process is performed with a rinse solution; a natural oxide film is removed by DHF; and a rinsing process is performed by DIW. Upon the completion of these liquid processes, IPA drying process is performed by supplying IPA onto the surface of the wafer W while the wafer W is being rotated. Then, the processes on the wafer W are completed. During these processes, liquid drain paths for the used processing solutions or gas exhaust paths for exhausting atmospheres are appropriately switched depending on the kind of the processing solutions.

After performing the liquid process as described, the wafer W is unloaded from the liquid processing unit 2, and then, loaded on the transit shelf 131 by the transfer arm 144. Then, the wafer W is returned back to the FOUP 100 from the transit shelf 131 by the first wafer transfer device 121. The above-described processes or the transfer of the wafer W are performed by the multiple liquid processing units 2 in the liquid processing apparatus 1. In this way, the liquid process is performed on the multiple wafers W one by one.

By way of example, if a particular one of the liquid processing units 2 malfunctions, maintenance process is performed as follows. First, the corresponding liquid processing unit 2 or the flow control unit 40 connected thereto is stopped. Then, the cover body 148 and the inner cover 462 corresponding to this liquid processing unit 2 are separated to allow the flow control unit 40 to become opened. Thereafter, the flow control unit 40 is accessed from the main maintenance region to be taken out. In this state, maintenance can be performed. Here, since the flow control unit 40 is provided for each liquid processing unit 2, the other liquid processing units 2 without having problems can be operated continuously. Further, if a problem occurs in the liquid supply nozzle 26 or the liquid supply pipe 252 of the liquid processing unit 2, the cover body 147 of the corresponding liquid processing unit 2 is separated such that maintenance of the corresponding liquid processing unit 2 is performed. At this time, processing atmospheres of the other liquid processing units 2 under operation can be maintained clean.

In accordance with the present embodiment, the liquid processing apparatus 1 has the following effects. In accordance with the present embodiment, under the multiple liquid processing units 2 arranged side by side in the horizontal direction, the gas exhaust pipe 3 extended along the arrangement direction of the liquid processing units 2; the flow control block 4 accommodating the flow control member group 402 for liquid supply; and the liquid supply main pipe 5 and the liquid drain main pipe 6 respectively extended along the arrangement direction of the liquid processing units 2 are located in sequence from the top. Accordingly, the flow control member group 402 can be intensively arranged. Further, maintenance can be performed easily from the lateral side of the arrangement of the liquid processing units 2. As a result, assembly of the liquid processing apparatus 1 or maintenance of the flow control units 40 can be easily performed.

Furthermore, among the pipes 3, 5, and 6 of the power supply system, by disposing the gas exhaust pipe 3 at the position closest to the liquid processing unit 2, pressure loss can be suppressed, and an exhaust amount allotted to the liquid processing apparatus 1 in the overall exhaust capacity of a factory can be reduced.

Figure 14:
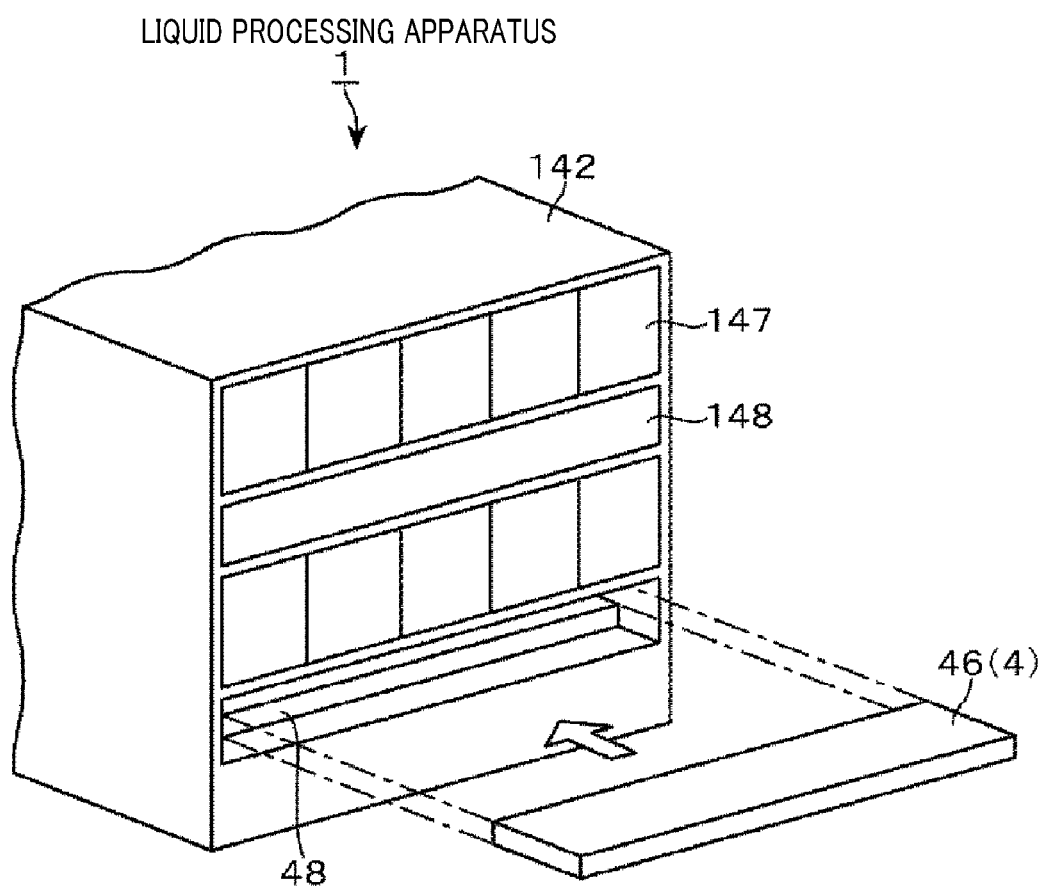
FIG. 14 is a perspective view illustrating a state in which the flow control block is installed to the liquid processing apparatus during the assembly of the liquid processing apparatus.

Moreover, the flow control block 4 is configured to accommodate, in the common housing body 46, the flow control units 40 (flow control member group 402) provided on the supply pipe. In this configuration, as illustrated in FIG. 14, when assembling the liquid processing apparatus 1, a main body of the liquid processing apparatus 1 and the flow control block 4 can be assembled individually at different places at the same time. Then, the housing body 46 accommodating the flow control unit 40 may be combined with the main body of the liquid processing apparatus 1. As a result, the liquid processing apparatus 1 can be easily assembled. In addition, since the liquid processing unit 2, the gas exhaust pipe 3, the flow control block 4, the liquid supply main pipe 5, and the liquid drain main pipe 6 are vertically arranged, interference among these components in the horizontal direction can be avoided. Thus, it may be possible to easily disassemble the components within the liquid processing section 141, and to easily cope with the specification change of the liquid processing apparatus 1. Moreover, as described in FIG. 3, by providing the fan unit 72 at the lateral side of each liquid processing unit 2, the height of the liquid processing apparatus 1 can be lowered.

Moreover, the liquid processing apparatus 1 has also the following effects. The flow control unit 40 is configured by intensively arranging, on the supporting plate 401, the flow control member group 402 connected with the supply pipes 561 and 562. Further, the upstream port 403 and the downstream port 406 are provided at the supporting plate 401 so as to be close to the main maintenance region. The upstream port 403 is detachably attached to the upstream supply pipe 561 at the upstream side of the flow control member group 402, and the downstream port 406 is detachably attached to the downstream supply pipe 562 at the downstream side of the flow control member group 402. Accordingly, when performing maintenance of the upstream supply pipe 561 and the downstream supply pipe 562 or the flow control member group 402 (flowmeter 404 or flow control valve 405), the upstream supply pipe 561 and the downstream supply pipe 562 can be detached at the main maintenance region. Then, after performing the maintenance of the upstream supply pipe 561 and the downstream supply pipe 562, or the flow control member group 402, the upstream supply pipe 561 and the downstream supply pipe 562 can be reconnected with the flow control member group 402. Thus, the maintenance or the assembly of the apparatus can be easily performed. As a result, a maintenance burden on the operator can be reduced.

Here, the configuration of the flow control unit 40 may not be limited to the aforementioned example in which the supporting plate 401 is configured to be separable from the housing body 46 toward the main maintenance region. For example, the flow control unit 40 may be fixed in the housing body 46. In this case, if the flow control member group 402 is configured to be separable from the supporting plate 401, the flow control member group 402 can be easily separated since the upstream port 403 and the downstream port 406 are formed so as to be close to the main maintenance region.

Moreover, the flow control unit 40 including the flow control member group 402 detachably mounted on the supporting plate 401 may also be applied to a liquid processing apparatus 1 including, e.g., only one liquid processing unit 2 as well as to the liquid processing apparatus 1 having multiple liquid processing units 2.

Besides, the liquid processing apparatus to which the above described embodiments are applicable may not be limited to performing the liquid process on the wafer W by supplying the acid or alkaline processing solution. By way of example, the liquid processing apparatus in accordance with the present disclosure can also be applied to performing, on the surface of the wafer W, various types of liquid process such as a plating process by a plating solution, an etching process by an etching solution, or the like.

What is claimed is:

1. A liquid processing apparatus comprising:
    a plurality of liquid processing units, arranged side by side in a horizontal direction, each for performing a liquid process on a substrate by using a processing solution;
    at least one gas exhaust pipe, extended along an arrangement direction of the liquid processing units and provided below the liquid processing units, for exhausting an atmosphere within each of the liquid processing units;
    a plurality of flow control member groups for liquid supply provided below the at least one gas exhaust pipe;
    at least one liquid supply main pipe for supplying a processing solution into each of the liquid processing units and at least one liquid drain main pipe for draining the liquid processing solution from each of the liquid processing units, the at least one liquid supply main pipe and the at least one liquid drain main pipe being extended along the arrangement direction of the liquid processing units and provided below the flow control member groups;
    a plurality of liquid supply branch pipes that are branched from the at least one liquid supply main pipe into each of the liquid processing units and connected with the liquid processing units via the flow control member groups for liquid supply; and
    a plurality of liquid drain branch pipes that are branched from the at least one liquid drain main pipe into each of the liquid processing units and connected with the liquid processing units,
    wherein a part of the plurality of flow control member groups is accommodated in a respective housing portion provided below each of the liquid processing units, and each housing portion is disposed below the at least one gas exhaust pipe,
    the at least one liquid supply main pipe and the at least one liquid drain main pipe are accommodated in a pipe box provided below the each housing portion,
    a lateral region along the each housing portion, facing the arrangement of the liquid processing units, is set as a main maintenance region, and
    individual flow control member groups are mounted to respective removable supporting plates that are separately removable from the each housing portion toward the main maintenance region.

2. The liquid processing apparatus of claim 1, wherein all of the plurality of flow control member groups are accommodated in a common housing, and the common housing is disposed below the at least one gas exhaust pipe.

3. The liquid processing apparatus of claim 1, wherein the at least one gas exhaust pipe is plural in number, and the gas exhaust pipes are arranged in a horizontal direction.

4. The liquid processing apparatus of claim 2, wherein the at least one gas exhaust pipe is plural in number, and the gas exhaust pipes are arranged in a horizontal direction.

5. The liquid processing apparatus of claim 1, wherein the at least one liquid supply main pipe is plural in number, and the liquid supply main pipes are arranged in a horizontal direction.

6. The liquid processing apparatus of claim 2, wherein the at least one liquid supply main pipe is plural in number, and the liquid supply main pipes are arranged in a horizontal direction.

7. The liquid processing apparatus of claim 2, wherein the pipe box includes a plurality of pipe boxes, and the at least one liquid supply main pipe and the at least one liquid drain main pipe are accommodated in the plurality of pipe boxes, and the pipe boxes are arranged side by side in a horizontal direction.

8. The liquid processing apparatus of claim 1, wherein, a lateral region facing the arrangement of the liquid processing units from a position opposite to the main maintenance region via the arrangement of the liquid processing units is set as a sub maintenance region, and a part of the flow control member groups corresponding to each of the liquid processing units is configured to be taken out toward the side of the main maintenance region.

9. The liquid processing apparatus of claim 1, wherein, a lateral region facing the arrangement of the liquid processing units from a position opposite to the main maintenance region via the arrangement of the liquid processing units is set as a sub maintenance region, the at least one liquid supply main pipe is plural in number, and a part of the flow control member groups corresponding to each of the processing solutions is configured to be taken out toward the side of the main maintenance region.

10. The liquid processing apparatus of claim 1, further comprising:
a clean air supply unit for forming a descending current of clean air within the liquid processing units,
wherein the clean gas supply unit is provided above the liquid processing units and extended along the arrangement direction of the liquid processing units.

11. The liquid processing apparatus of claim 1,
wherein a removable cover is provided on a side surface of the housing portion to correspond to each of the liquid processing units.

12. The liquid processing apparatus of claim 11, wherein when one of the liquid processing units malfunctions, the removable cover corresponding to said one of the liquid processing units is separated to allow the housing portion to become opened.

13. The liquid processing apparatus of claim 11, wherein the removable cover provides access, from the main maintenance region, to individual flow control member groups mounted to the respective removable supporting plates.

* * * * *